(12) United States Patent
Werber et al.

(10) Patent No.: US 9,274,434 B2
(45) Date of Patent: Mar. 1, 2016

(54) LIGHT MODULATOR AND ILLUMINATION SYSTEM OF A MICROLITHOGRAPHIC PROJECTION EXPOSURE APPARATUS

(71) Applicant: Carl Zeiss SMT GmbH, Oberkochen (DE)

(72) Inventors: Armin Werber, Gottenheim (DE); Severin Waldis, Bern (CH); Florian Bach, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 8 days.

(21) Appl. No.: 14/249,730

(22) Filed: Apr. 10, 2014

(65) Prior Publication Data

US 2014/0218708 A1   Aug. 7, 2014

Related U.S. Application Data

(63) Continuation of application No. PCT/EP2011/005737, filed on Nov. 15, 2011.

(51) Int. Cl.
*G03B 27/54* (2006.01)
*G03B 27/72* (2006.01)
*G03F 7/20* (2006.01)
*G02B 26/08* (2006.01)

(52) U.S. Cl.
CPC ........ *G03F 7/70191* (2013.01); *G02B 26/0833* (2013.01); *G02B 26/0841* (2013.01); *G03F 7/70058* (2013.01); *G03F 7/70116* (2013.01)

(58) Field of Classification Search
CPC ............ G03F 7/70116; G03F 7/70108; G03F 7/70191
USPC .......................... 355/53, 67–71; 359/291–292
See application file for complete search history.

(56) References Cited

U.S. PATENT DOCUMENTS

| | | | |
|---|---|---|---|
| 5,719,695 A | 2/1998 | Heimbuch | |
| 6,275,325 B1* | 8/2001 | Sinclair | 359/291 |
| 7,167,297 B2 | 1/2007 | Huibers | |
| 7,483,198 B2* | 1/2009 | Doan | B82Y 30/00 |
| | | | 359/291 |
| 2004/0100680 A1 | 5/2004 | Huibers et al. | |
| 2006/0087634 A1 | 4/2006 | Brown et al. | |
| 2006/0209386 A1 | 9/2006 | Sudak et al. | |
| 2009/0002668 A1* | 1/2009 | Rohe et al. | 355/67 |

(Continued)

FOREIGN PATENT DOCUMENTS

| | | |
|---|---|---|
| CN | 101669071 | 3/2010 |
| EP | 1 262 836 A1 | 12/2002 |

(Continued)

OTHER PUBLICATIONS

International Search Report for corresponding PCT Appl No. PCT/EP2011/005737, dated Dec. 20, 2011.

(Continued)

*Primary Examiner* — Hung Henry Nguyen
(74) *Attorney, Agent, or Firm* — Fish & Richardson P.C.

(57) ABSTRACT

An illumination system of a microlithographic projection exposure apparatus comprises a light modulator which includes a modulator substrate and an array of mirrors that are supported by the modulator substrate. At least some adjacent mirrors partly overlap. The light modulator further comprises a plurality of actuators that are supported by the modulator substrate and are configured to tilt the mirrors individually.

20 Claims, 6 Drawing Sheets

(56) References Cited

U.S. PATENT DOCUMENTS

2009/0097094 A1* 4/2009 Tanaka .................. 359/239
2010/0060873 A1 3/2010 Deguenther

FOREIGN PATENT DOCUMENTS

| EP | 2 233 960 | 9/2010 |
|---|---|---|
| JP | 2001-356282 | 12/2001 |
| JP | 2010-525589 | 7/2010 |
| JP | 2013-254978 | 12/2013 |
| WO | WO 03/102664 | 12/2003 |
| WO | WO 2008/131928 | 11/2008 |
| WO | WO 2008/131930 | 11/2008 |
| WO | WO 2010/008552 | 1/2010 |
| WO | WO 2010/040506 | 4/2010 |

OTHER PUBLICATIONS

Japanese Office Action with English translation thereof for JP Appl. No. 2014-541542, 7 pages, dated Jul. 23, 2015.

* cited by examiner

LIGHT MODULATOR AND ILLUMINATION SYSTEM OF A MICROLITHOGRAPHIC PROJECTION EXPOSURE APPARATUS

CROSS-REFERENCE TO RELATED APPLICATIONS

The present application is a continuation of, and claims benefit under 35 USC 120 to, international application PCT/EP2011/005737, filed Nov. 15, 2011. The entire disclosure of international application PCT/EP2011/005737 is incorporated by reference herein.

BACKGROUND OF THE INVENTION

1. Field of the Invention

The invention generally relates to a light modulator comprising an array of mirrors and more specifically to an illumination system of a microlithographic projection exposure apparatus comprising such a light modulator.

2. Description of Related Art

Microlithography (also referred to as photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to light of a certain wavelength. Next, the wafer with the photoresist on top is exposed to projection light through a mask in a projection exposure apparatus. The mask contains a circuit pattern to be imaged onto the photoresist. After exposure the photoresist is developed to produce an image that corresponds to the circuit pattern contained in the mask. Then an etch process transfers the circuit pattern into the thin film stacks on the wafer. Finally, the photoresist is removed. Repetition of this process with different masks results in a multi-layered microstructured component.

A projection exposure apparatus typically includes an illumination system that illuminates a field on the mask that may have the shape of a rectangular or curved slit, for example. The apparatus further comprises a mask stage for aligning the mask, a projection objective (sometimes also referred to as 'the lens') that images the illuminated field on the mask onto the photoresist, and a wafer alignment stage for aligning the wafer coated with the photoresist.

One of the essential aims in the development of projection exposure apparatus is to be able to lithographically define structures with smaller and smaller dimensions on the wafer. Small structures lead to a high integration density, which generally has a favorable effect on the performance of the microstructured components produced with the aid of such apparatus.

Various approaches have been pursued in the past to achieve this aim. One approach has been to reduce the wavelength of the projection light used to image the circuit pattern onto the photoresist. This exploits that fact that the minimum size of the features that can be lithographically defined is approximately proportional to the wavelength of the projection light. Therefore the manufacturers of such apparatus strive to use projection light having shorter and shorter wavelengths. The shortest wavelengths currently used are 248 nm, 193 nm and 157 nm and thus lie in the deep (DUV) or vacuum (VUV) ultraviolet spectral range. The next generation of commercially available apparatus will use projection light having an even shorter wavelength of about 13.5 nm which is in the extreme ultraviolet (EUV) spectral range. An EUV apparatus contains mirrors instead of lenses because the latter absorb nearly all EUV light.

Another approach is to improve the illumination of the mask. Ideally, the illumination system of a projection exposure apparatus illuminates each point of the field illuminated on the mask with projection light having a well defined spatial and angular irradiance distribution. The term angular irradiance distribution describes how the total light energy of a light bundle, which converges towards a particular point on the mask, is distributed among the various directions of the rays that constitute the light bundle.

The angular irradiance distribution of the projection light impinging on the mask is usually adapted to the kind of pattern to be imaged onto the photoresist. For example, relatively large sized features may require a different angular irradiance distribution than small sized features. The most commonly used angular irradiance distributions are referred to as conventional, annular, dipole and quadrupole illumination settings. These terms refer to the irradiance distribution in a pupil surface of the illumination system. With an annular illumination setting, for example, only an annular region is illuminated in the pupil surface. Thus there is only a small range of angles present in the angular irradiance distribution of the projection light, and all light rays impinge obliquely with similar angles onto the mask.

Different mechanisms are known in the art to modify the angular irradiance distribution of the projection light in the mask plane so as to achieve the desired illumination setting. For achieving maximum flexibility in producing different angular irradiance distribution in the mask plane, it has been proposed to use mirror arrays that determine the irradiance distribution in the pupil surface.

In EP 1 262 836 A1 the mirror array is realized as a microelectromechanical system (MEMS) comprising more than 1000 microscopic mirrors. Each of the mirrors can be tilted about two orthogonal tilt axes. Thus radiation incident on such a mirror device can be reflected into almost any desired direction of a hemisphere. A condenser lens arranged between the mirror array and a pupil surface translates the reflection angles produced by the mirrors into locations in the pupil surface. This illumination system makes it possible to illuminate the pupil surface with a plurality of spots, wherein each spot is associated with one particular mirror and is freely movable across the pupil surface by tilting this mirror.

Similar illumination systems using mirror arrays are known from US 2006/0087634 A1, U.S. Pat. No. 7,061,582 B2 and WO 2005/026843 A2.

In one embodiment described in the aforementioned EP 1 262 836 A1 concentration optics comprising a plurality of parabolic reflective surfaces that divide the impinging projection light beam into a plurality of sub-beams that are directed individually towards the mirrors. This ensures that no projection light propagates through gaps that are formed between adjacent mirrors. Thus not only light losses are reduced, but this also ensures that the sensitive electronic components and actuators arranged underneath the mirrors are not heated up or damaged by projection light propagating through the gaps. However, such a concentrating optics adds to the complexity and costs of the illumination system.

US 2006/0209386 A1 describes a digital micromirror device (DMD) comprising anti-reflective coatings to reduce the effects of stray radiation on the performance of the device. The anti-reflective coating is arranged directly on top of a CMOS substrate of the DMD which is typically reflective for visible light.

U.S. Pat. No. 7,167,297 B2 discloses an array of micromirrors having a non-rectangular circumferential shape so as to minimize light diffraction.

SUMMARY OF THE INVENTION

It is an object of the present invention to provide a light modulator in which the risk that light significantly heats up and/or damages sensitive components that are arranged underneath the mirrors of the mirror array is reduced.

It is a further object of the present invention to provide an illumination system of a microlithographic projection exposure apparatus comprising an array of mirrors. The illumination system shall not require concentrating optics that separates the projection light into a plurality of sub-beams, but there shall be no risk that projection light significantly heats up and/or damages sensitive components that are arranged underneath the mirrors of the mirror array.

With respect to the light modulator, this object is achieved, in accordance with a first aspect of the present invention, by a light modulator comprising a modulator substrate and an array of mirrors that are supported by the modulator substrate. At least some adjacent mirrors partly overlap. A plurality of actuators are supported by the modulator substrate and are configured to tilt the mirrors individually.

As a result of the overlapping arrangement of adjacent mirrors, the amount of light that is able to penetrate through gaps formed between adjacent mirrors and to impinge on the actuators or on electronic components can be significantly reduced. Which of the adjacent mirrors overlap, and the degree of overlap, depends among others on the direction of the light when it impinges on the mirror array. Thus the mirrors themselves shield the sensitive components arranged underneath from the high energy projection light, and there is no need for additional light shields in the form of absorptive elements, for example.

The invention is most advantageous if the light modulator comprises illumination optics that is arranged between a light source and the array of mirrors and directs the light on the array of mirrors such that the latter is illuminated by at least one light beam which extends over at least some adjacent mirrors. However, the invention may also be used in optical systems in which concentrating optics produce a plurality of individual sub-beams that are separated from each other. Then the overlapping arrangement of the mirrors prevents stray light from reaching sensitive components that are arranged on the modulator substrate of the mirror array.

The mirrors may overlap to such an extent that no light at all is able to penetrate through a gap formed between adjacent mirrors and to impinge on one of the actuators or on electronic components that are supported by the modulator substrate.

If at least some adjacent mirrors partly overlap, this will usually require that the mirrors are arranged at different heights above the modulator substrate. Then the heights and lateral distances have to be determined such that the gaps between adjacent mirrors are arranged in the light shadows produced by the higher mirrors.

If the array of mirrors is a three dimensional array, this will usually require that the mirrors are arranged in three or even more different heights above the modulator substrate.

If the mirrors are arranged at different heights, the array may comprise an absorptive coating that is arranged on an underside of a substrate of one of the mirrors, wherein the underside faces the modulator substrate. Such absorptive coatings absorb light that is reflected from lower mirrors towards the undersides of higher mirrors.

According to another aspect of the invention, the above stated object is achieved by an illumination system of a microlithographic projection exposure apparatus comprising a light source which may be configured to produce projection light having a wavelength greater than 150 nm. The illumination system further comprises a light modulator comprising a modulator substrate and a plurality of mirrors that are supported by the modulator substrate and are arranged in an array so that gaps remain between adjacent mirrors through which a gas is allowed to flow. The light modulator further comprises a plurality of actuators that are supported by the modulator substrate and are configured to tilt the mirrors individually about a tilt axis. A plurality of absorber elements is provided in the light modulator, wherein each absorber element comprises a surface that is absorptive for the projection light. Furthermore, each absorber element is arranged between adjacent mirrors so that it at least partially prevents that projection light propagating through the gaps impinges on the actuators or on electronic components that are supported by the modulator substrate. In accordance with this aspect of the invention the absorptive elements are either attached to the mirrors or to ridges extending in the gaps. The illumination system further comprises illumination optics that is arranged between the light source and the light modulator and directs the projection light on the light modulator such that the light modulator is illuminated by at least one projection light beam which extends over at least two adjacent mirrors.

The absorptive surface may be configured such that it absorbs at least 99% of the impinging projection light.

In other embodiments the absorptive elements are attached to edges of the mirrors. In this case the absorptive elements may have an angled cross-section.

If the absorptive elements are attached to posts or ridges extending in the gaps, the mirrors may be suspended from these poles or ridges.

It is a further objective to provide a light modulator that produces less stray light during its operation.

This object is achieved, according to the invention, by a light modulator comprising a modulator substrate, an array of mirrors, and a plurality of actuators that are supported by the modulator substrate and are configured to tilt the mirrors individually about two tilt axes. At least some mirrors have a circumferential shape this is obtained by rotating a basis shape around an axis, which is at least substantially orthogonal to the tilt axes, by different rotational angles.

This avoids a perfectly regular arrangement and thus helps to prevent diffraction induced stray light.

This effect is further increased if the rotational angels are pseudo-randomly distributed within a range of rotational angles, for example between 0.1° and 30° and preferably between 1° and 5°.

DEFINITIONS

The term "light" denotes any electromagnetic radiation, in particular visible light, UV, DUV, VUV and EUV light and X-rays.

The term "light ray" is used herein to denote light whose path of propagation can be described by a line.

The term "light bundle" is used herein to denote a plurality of light rays that have a common origin in a field plane.

The term "light beam" is used herein to denote light that passes through a particular lens or another optical element.

The term "optical raster element" is used herein to denote any optical element, for example a lens, a prism or a diffractive optical element, which is arranged, together with other optical raster elements, so that a plurality of adjacent optical channels are produced or maintained.

The term "optical integrator" is used herein to denote an optical system that increases the product NA·a, wherein NA is the numerical aperture and a is the illuminated field area.

The term "condenser" is used herein to denote an optical element or an optical system that establishes (at least approximately) a Fourier relationship between two planes, for example a field plane and a pupil plane.

The term "surface" is used herein to denote any plane or curved surface in the three-dimensional space. The surface may be part of a body or may be completely separated therefrom, as it is usually the case with a field or a pupil plane.

BRIEF DESCRIPTION OF THE DRAWINGS

Various features and advantages of the present invention may be more readily understood with reference to the following detailed description taken in conjunction with the accompanying drawings in which.

DESCRIPTION OF PREFERRED EMBODIMENTS

I. General Construction of Projection Exposure Apparatus

Figure 1:
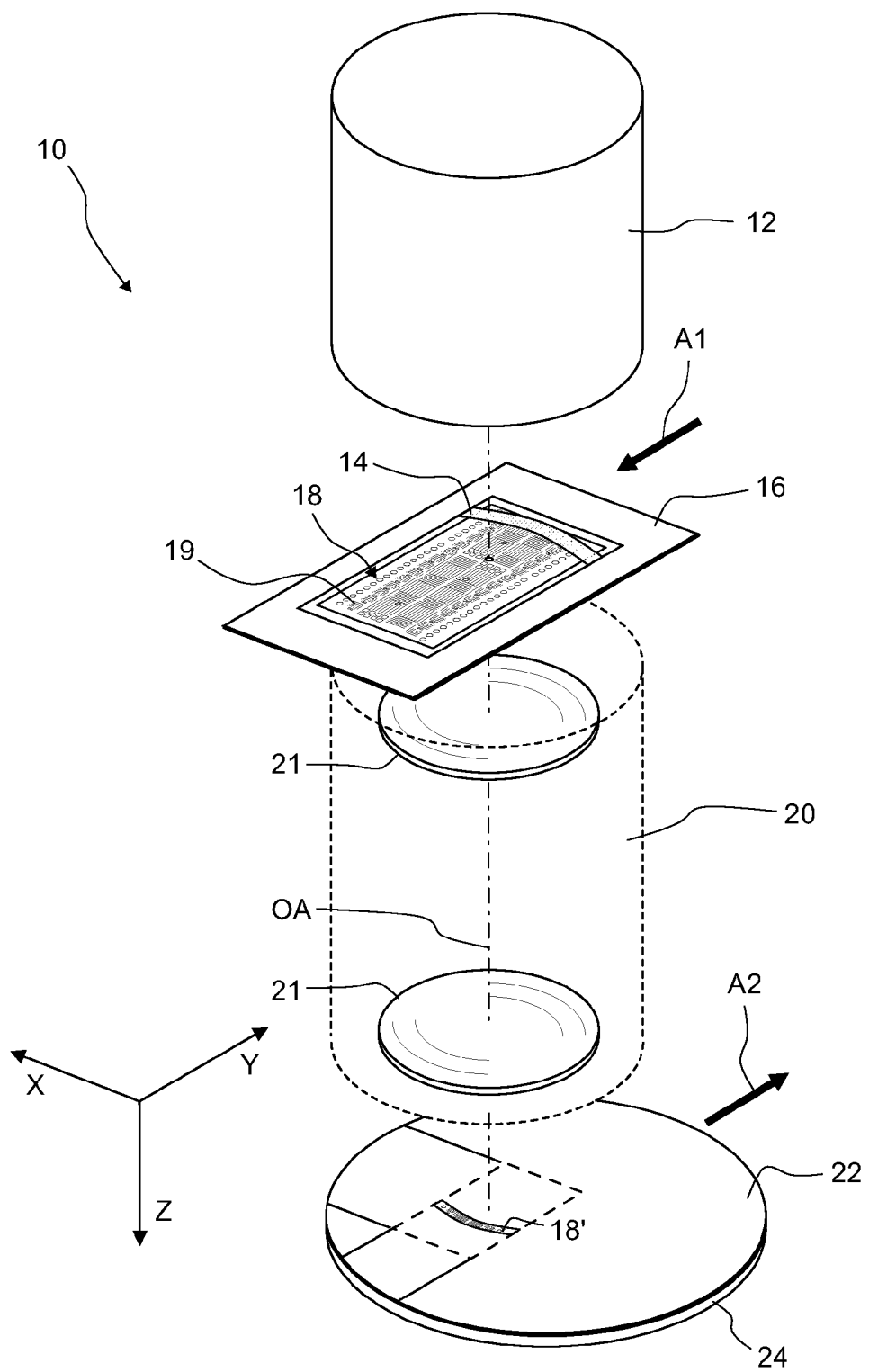
FIG. 1 is a schematic perspective view of a projection exposure apparatus.

FIG. 1 is a perspective and highly simplified view of a projection exposure apparatus 10 in accordance with the present invention. The apparatus 10 comprises an illumination system 12 which produces a projection light beam (not shown). The latter illuminates a field 14 on a mask 16 containing a pattern 18 formed by a plurality of small features 19 that are schematically indicated in FIG. 1 as thin lines. In this embodiment the illuminated field 14 has the shape of a ring segment. However, other shapes of the illuminated field 14, for example rectangles, are contemplated as well.

A projection objective 20 images the pattern 18 within the illuminated field 14 onto a light sensitive layer 22, for example a photoresist, which is supported by a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned via a mask stage (not shown) in an object plane of the projection objective 20. Since the latter has a transverse magnification $\beta$ with $|\beta|<1$, a minified image 18' of the pattern 18 within the illuminated field 14 is projected onto the light sensitive layer 22.

In this embodiment the design of the projection objective 20 requires that the illuminated field 14 is positioned off the optical axis 26 of the projection objective 20. With other types of projection objectives, the illuminated field 14 may be centered on the optical axis 26.

During the projection the mask 16 and the substrate 24 move along a scan direction which corresponds to the Y direction indicated in FIG. 1. The illuminated field 14 then scans over the mask 16 so that patterned areas larger than the illuminated field 14 can be continuously imaged. The ratio between the velocities of the substrate 24 and the mask 16 is equal to the transverse magnification $\beta$ of the projection objective 20. If the projection objective 20 inverts the image ($\beta<0$), the mask 16 and the substrate 24 move in opposite senses, as this is indicated in FIG. 1 by arrows A1 and A2. However, the present invention may also be used in stepper tools in which the mask 16 and the substrate 24 do not move during projection of the mask.

II. General Construction of Illumination System

Figure 2:
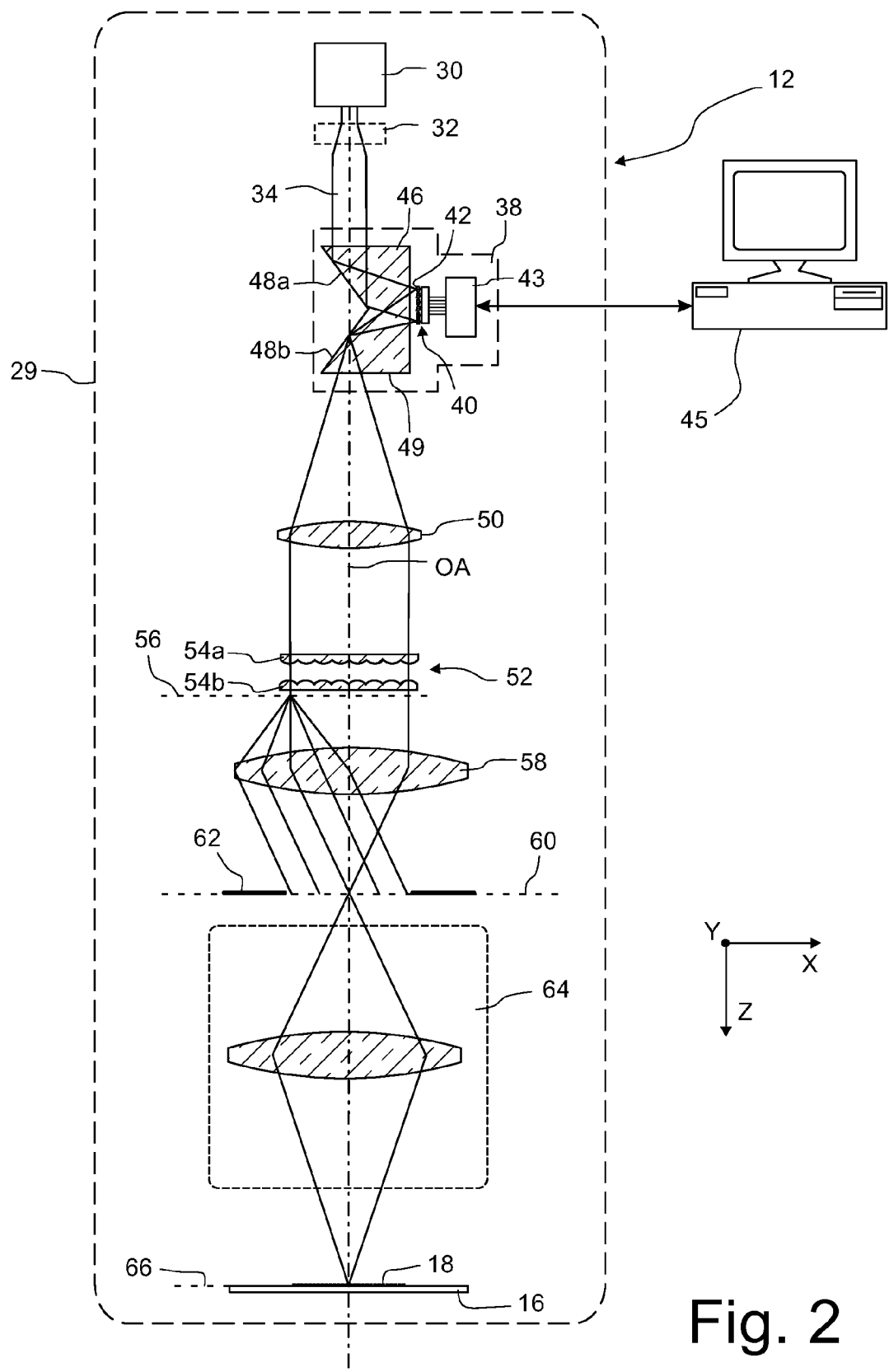
FIG. 2 is a meridional section through an illumination system which is part of the apparatus shown in FIG. 1.

FIG. 2 is a meridional section through the illumination system 12 shown in FIG. 1. For the sake of clarity, the illustration of FIG. 2 is considerably simplified and not to scale. This particularly implies that different optical units are represented by one or very few optical elements only. In reality, these units may comprise significantly more lenses and other optical elements.

The illumination system 12 includes a housing 29 and a light source 30 that is, in the embodiment shown, realized as an excimer laser. The light source 30 emits projection light having a wavelength of about 193 nm. Other types of light sources 30 and other wavelengths, for example 248 nm or 157 nm, are also contemplated.

In the embodiment shown, the light beam emitted by the light source 30 enters a beam expansion unit indicated at 32 in which the light beam is expanded. To this end the beam expansion unit 32 may comprise several lenses or planar mirrors, for example. The expanded light beam 34 emerging from the beam expansion unit 32 has a low divergence, i.e. it is almost collimated.

The expanded light beam 34 now enters a light modulator 38 that is used to produce variable spatial irradiance distributions in a subsequent pupil plane. To this end the light modulator 38 comprises an array 40 of micromirrors 42 that can be tilted individually about two orthogonal axes with the help of actuators. The actuators are controlled by a control unit 43 which is connected to an overall system control 45.

Figure 3:
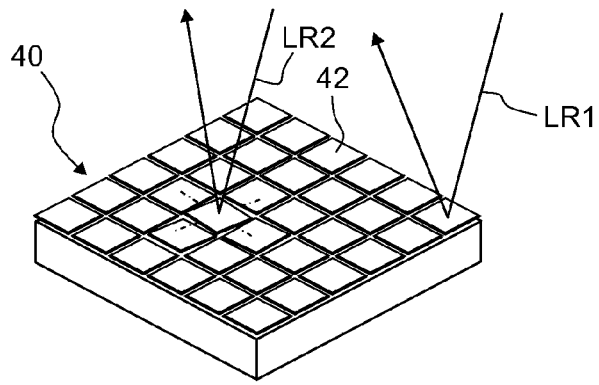
FIG. 3 is a perspective view of a mirror array contained in the illumination system shown in FIG. 2.

FIG. 3 is a perspective view of the array 40 illustrating how two light rays LR1, LR2 are reflected into different directions depending on the tilting angles of the micromirrors 42 on which the light rays LR1, LR2 impinge. In FIGS. 2 and 3 the array 40 comprises only 66 micromirrors 42; in reality the array 40 may comprise several hundreds or even several thousands micromirrors 42.

Referring again to FIG. 2, the light modulator 38 further comprises a prism 46 having a first plane surface 48a and a second plane surface 48b that are both inclined with respect to the optical axis OA of the illumination system 12. At these inclined surfaces 48a, 48b the light beam 34 is reflected by total internal reflection. The first surface 48a reflects the light beam 34 towards the micromirrors 42 of the mirror array 40, and the second surface 48b directs the individual light beams reflected from the micromirrors 42 towards an exit surface 49 of the prism 46. The directions of the reflected light beams, and thus the angular irradiance distribution of the projection light emerging from the exit surface 49 of the prism 46, can thus be varied by individually tilting the micromirrors 42 of the array 40. More details with regard to the light modulator 40 can be gleaned from US 2009/0115990 A1, for example.

Figure 4:
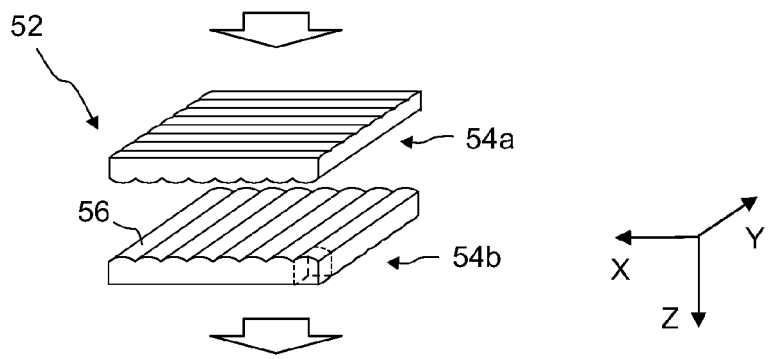
FIG. 4 is a perspective view of an optical integrator contained in the illumination system shown in FIG. 2.

The angular irradiance distribution produced by the light modulator 38 is transformed into a spatial irradiance distribution with the help of a first condenser 50 which directs the impinging light beams towards an optical integrator 52. As shown in the perspective view of FIG. 4, the optical integrator 52 comprises in this embodiment two optical raster plates 54a, 54b each containing two orthogonal arrays of cylindrical microlenses 56. The optical integrator 52 produces a plurality of secondary light sources in a subsequent pupil plane 56 of the illumination system 12. A second condenser 58 establishes a Fourier relationship between the pupil plane 56 and a field stop plane 60 in which an adjustable field stop 62 is arranged. The second condenser 58 superimposes the light beams emerging from the secondary light sources in the field stop plane 60 so that the latter is illuminated very homogenously.

The field stop plane 60 is imaged by a field stop objective 64 onto a mask plane 66 in which the mask 16 is arranged with the help of a mask stage (not shown). Also the adjustable field stop 62 is thereby imaged on the mask plane 66 and defines at least the short lateral sides of the illuminated field 14 that extend along the scan direction Y.

The irradiance distribution in front of the optical integrator 52 determines the irradiance distribution in the pupil plane 56 and thus the angular irradiance distribution in the field stop plane 60 and the mask plane 66. By carefully setting the tilting angles of the micromirrors 42 of the mirror array 40 with the help of the control unit 43, it is thus possible to quickly produce almost any arbitrary angular irradiance distribution in the mask plane 66. This, in turn, makes it possible to quickly adapt the angular irradiance distribution in the mask plane 66 to the pattern 18 contained in the mask 16. With an optimized angular irradiance distribution the pattern 18 can be imaged more accurately onto the light sensitive layer 22.

III. Configuration of Mirror Array

In the following various embodiments of the mirror array 40 will be described with reference to FIGS. 5 to 11.

1. Absorber Elements

Figure 5:
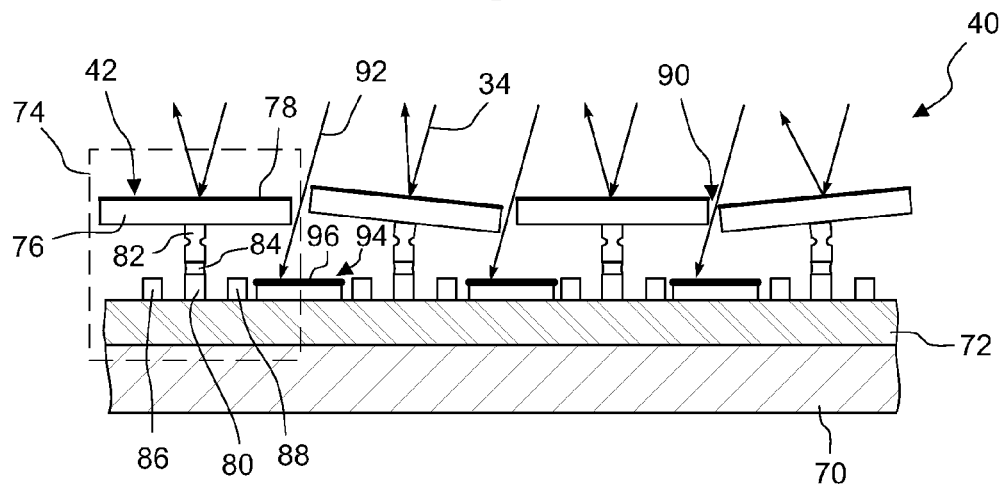
FIG. 5 is a sectional view through a mirror array contained in the illumination system shown in FIG. 2 according to a first embodiment comprising absorptive elements that are arranged on a substrate of the mirror array.

FIG. 5 is a sectional view through a portion of the mirror array 40 according to a first embodiment. The mirror array 40 comprises a substrate 70 which supports a plurality of electronic components 72 which are not shown in detail, but only as a single circuit layer. The substrate 70 further supports a plurality of mirror units 74 each comprising one of the micromirrors 42 and those electronic components that are functionally associated with the micromirror 42. Each micromirror 42 comprises, in turn, a mirror substrate 76 and a reflective coating 78 applied thereon and consisting, for example, of a plurality of thin layers having alternate refractive indices.

Each mirror unit 74 further comprises a base 80 which supports two solid state joint members 82, 84 which enable the micromirrors 42 to tilt around two orthogonal tilt axes that are defined by the configuration of the solid state joint members 82, 84. Also included in each mirror unit 74 is a plurality of actuators 86, 88 that are configured to tilt the associated micromirror 42 about the two tilt axes. To this end the actuators 86, 88 may exert electrostatic forces on the micromirror 42, as it is described, for example, in WO 2010/040506 A1.

In the embodiment shown in FIG. 5 the bases 80 of the mirror units 74 are mounted on top of the electronic components 72. However, it is also envisaged to mount the bases immediately on the substrate 70, as it is known in the art as such.

Between adjacent micromirrors 42 of the mirror array 40 small gaps 90 remain that are necessary to prevent contacts between the micromirrors 42 when they are tilted with the help of the actuators 86, 88. The gaps 90 have also the positive effect that a gas can flow through the gaps 90 into and out of the cavities which are formed underneath the micromirrors 42. This helps to remove convectively heat which is produced by the electronic components 72 and by absorption of the projection light 34 in the reflective coatings 78 of the micromirrors 42.

However, since the projection light 34 impinges on the mirror array 40 as a single continuous projection light beam, not only gas but also a fraction of the projection light 34 is able to pass through the gaps 90. In FIG. 5 this fraction of the projection light 34 is illustrated by arrows 92. If this fraction 92 of the projection light impinges on the actuators 86, 88 and/or the electronic components 72, it will be absorbed and cause a temperature increase which may impair the operation of the mirror array 40. The high energy projection light may even partly ionize the actuators 86, 88 and/or the electronic components 72 by transferring a part of its energy to a scattering electron (Compton effect). Furthermore, the impact of the high energy projection light may cause material degradations in the long term.

In order to avoid at least some of the negative effects that would be produced by projection light impinging on the actuators 86, 88 and/or the electronic components 72, a plurality of absorber elements 94 are arranged between adjacent micromirrors 42. Each absorber element 94 comprises an absorptive surface 96 that is configured to absorb most of the projection light that propagates through the gaps 90 formed between adjacent micromirrors 42. In this embodiment the absorber elements 94 are arranged on top of the electronic components 72. The absorber elements 94 may also consist exclusively of the absorptive surface 96, which would then be directly applied on the electronic components 72.

Figure 6:
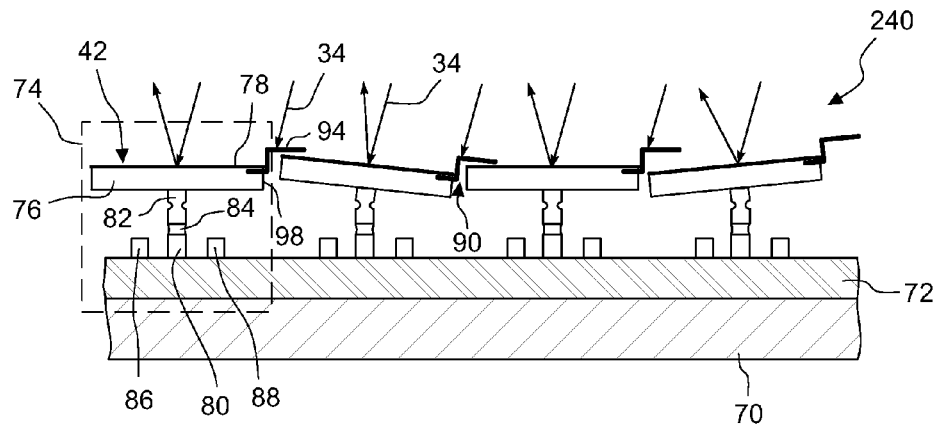
FIG. 6 is a sectional view through a mirror array contained in the illumination system shown in FIG. 2 according to a second embodiment comprising absorptive elements that are attached to the edges of the mirrors.

FIG. 6 is a sectional view through a portion of a mirror array 240 according to a second embodiment. In this embodiment the absorber elements 94 are not attached to the substrate 70, the actuators 86, 88 or the electronic components that are supported by the substrate 70, but are attached to edges 98 of the micromirror substrates 76. The absorber elements 94 have an angled cross-section which is determined such that the micromirrors 42 are still allowed to freely tilt, together with the absorber elements 94, around the two tilt axes without getting in contact with an adjacent micromirror. Attaching the absorber elements 94 to the micromirror substrates 76 has the advantage that no projection light at all is allowed to penetrate into the gaps 90. Therefore heat, which is produced by absorption of the projection light in the absorber elements, is kept away from the sensible electronic components 72 and the actuators 86, 88 and can be more easily removed from the mirror array 240 by a gas flowing over the surfaces of the mirror array 240.

In principle, instead of providing the absorber elements 94 with an absorbing surface, a reflective surface may be supported by the absorber elements 94 (which then should, strictly speaking, not be referred to as absorber elements). The reflective surface of a micromirror 42 then direct the projection light towards the same direction as the surface covered by the reflective coating 78 of the micromirror 42 does.

Figure 7:
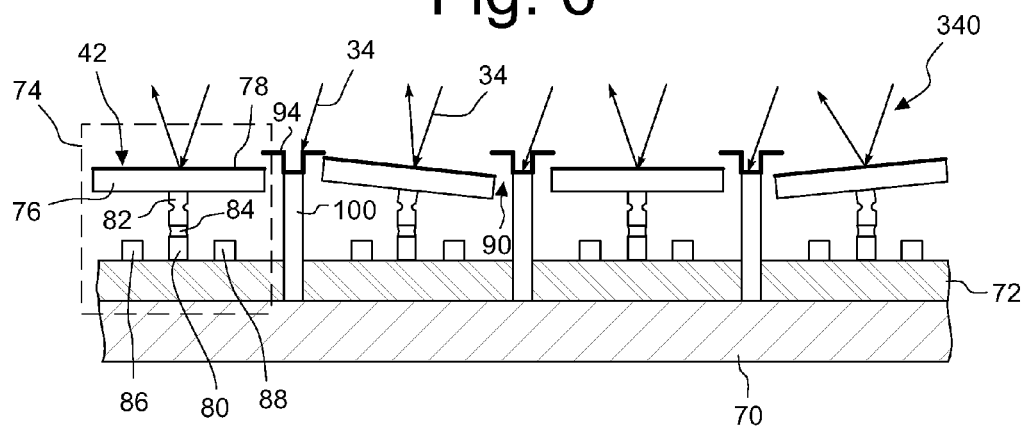
FIG. 7 is a sectional view through a mirror array contained in the illumination system shown in FIG. 2 according to a third embodiment comprising absorptive elements that are attached to ridges extending in gaps between adjacent mirrors.

In the third embodiment shown in FIG. 7 the mirror array 340 comprises absorber elements 94 that are arranged on ridges 100 that stand erect from the substrate 70 between the micromirrors 42. The effect is similar to the absorber elements 94 of the mirror array 240 shown in FIG. 6.

Figure 8:
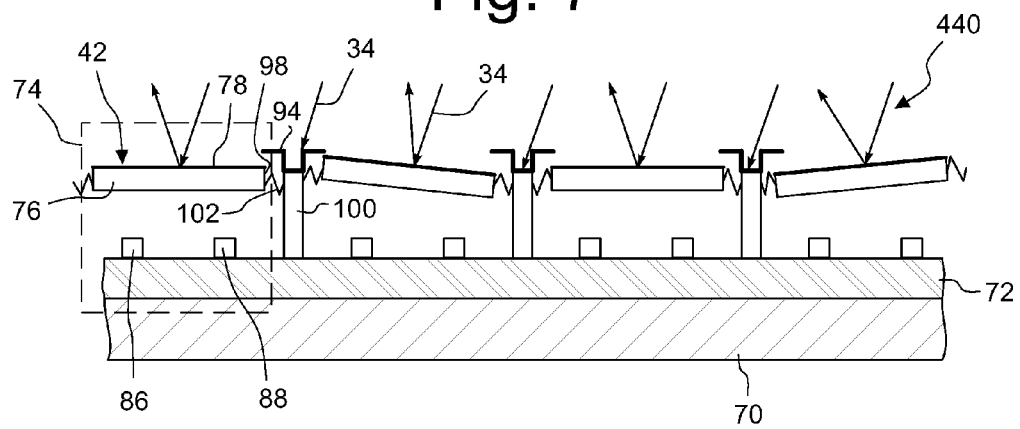
FIG. 8 is a sectional view through a mirror array contained in the illumination system shown in FIG. 2 according to a fourth embodiment that differs from the embodiment shown in FIG. 3 in that the mirrors are suspended from the ridges.

The fourth embodiment of a mirror array 440 shown in FIG. 8 differs from the mirror array 340 shown in FIG. 7 mainly in that the micromirrors 42 are not supported by solid state joints, but are suspended from the ridges 100 to which the absorber elements 94 are attached. To this end flexure strips 102 extend between the ridges 100 and the edges 98 of the micromirror substrates 76.

2. Mirror Overlap

Figure 9:
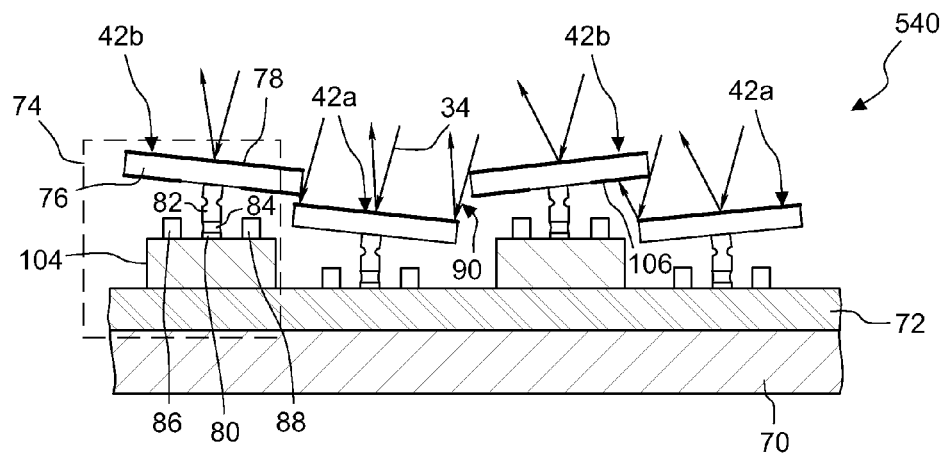
FIG. 9 is a sectional view through a mirror array contained in the illumination system shown in FIG. 2 according to a fifth embodiment in which some adjacent mirrors partly overlap.

FIG. 9 is a sectional view through a mirror array 540 according to a fifth embodiment in which at least some adjacent micromirrors partly overlap. To this end the micromirrors are arranged at different heights above the substrate 70. More specifically, first micromirrors 42a are arranged at a smaller height above the substrate 70 than second mirrors 42b. Along one direction the first and second micromirrors 42a, 42b alternate, as it is shown in the cross-section of FIG. 9.

Since the projection light 34 impinges obliquely on the mirror array 540, it is not necessary that all adjacent first and second micromirrors 42a, 42b partly overlap. For example, the two micromirrors 42a, 42b in the middle of FIG. 9 do not overlap, because the projection light 34 cannot penetrate through the gap 90 formed between these two micromirrors 42a, 42b such that it finally impinges on one of the actuators 86, 88 or on the electronic components 72.

For the other micromirrors 42a, 42b shown in FIG. 9, however, only an overlapping arrangement of the micromirrors 42a, 42b ensures that projection light 34 is prevented from reaching the actuators 86, 88 or the electronic components 72. It can be seen that for these micromirrors 42a, 42b projection light 34 in the vicinity of the gaps 90 will generally impinge on one of the lower first micromirrors 42a and will be reflected from it towards the underside of an adjacent higher second micromirror 42b. In order to prevent that projection light impinging on the underside of the second micromirrors 42b is reflected towards the actuators 86, 88 or the electronic components 72, these undersides are covered with absorptive coatings 106.

In a three dimensional array it will generally be necessary to arrange the micromirrors at three different heights above the substrate 70. Only then the micromirrors can overlap along two orthogonal directions, as it will be generally required.

Figure 10:
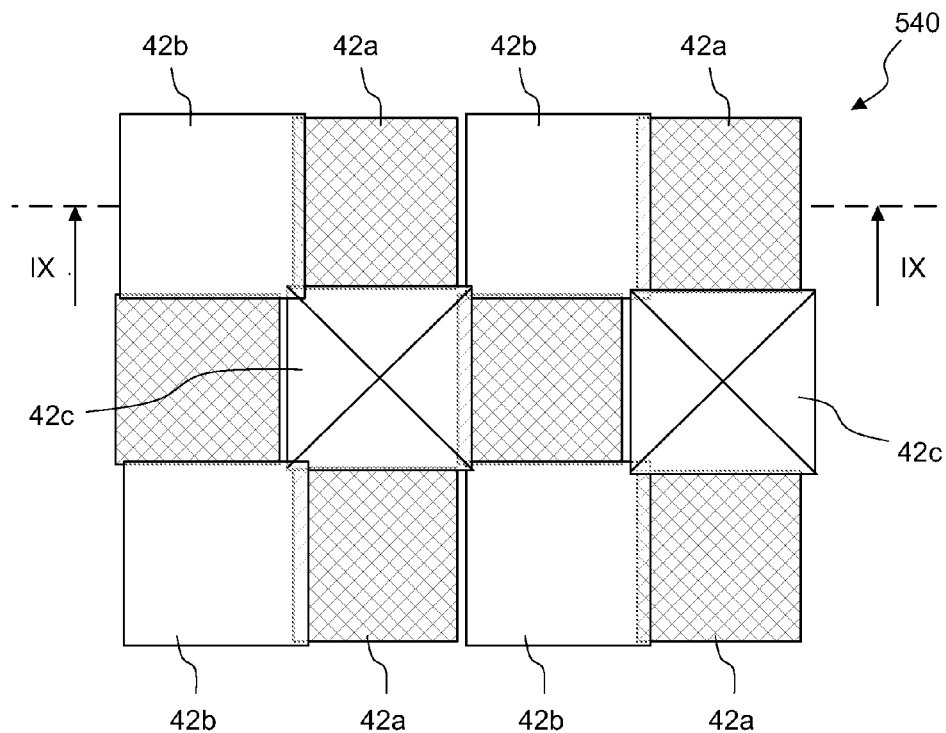
FIG. 10 is a top view on the mirror array shown in FIG. 9.

This is illustrated in the top view of FIG. 10 in which third micromirrors 42c are arranged in an alternating arrangement with the first and second micromirrors 42a, 42b. The third micromirrors 42c have the greatest height above the substrate 70. Only the first micromirrors 42a that are arranged in the shadow of higher micromirrors 42b or 42c do not overlap with these higher micromirrors 42b, 42c. The direction of the shadow depends on the direction of incidence of the projection light 34.

As a matter of course, it may also be envisaged to arrange the micromirrors 42a, 42b, 42c such that all adjacent micromirrors overlap so that a completely regular arrangement of the micromirrors 42a, 42b, 42c is obtained. However, leaving larger gaps 90 between adjacent micromirrors may be advantageous with a view to the removal of heat by convection.

Furthermore, various other arrangements for the actuators 86, 88 may be devised. For example, the actuators 86, 88 may be arranged all in the same plane even if the micromirrors 42a, 42b, 42c are arranged at different heights above the substrate 70. It may also be envisaged to attach the actuators 86, 88 directly underneath the mirrors 42a, 42b, 42c.

Although the embodiments described above relate to VUV projection exposure apparatus, the invention may equally be used in EUV apparatus comprising a light source is configured to produce projection light having a wavelength below 50 nm.

3. Rotated Arrangement

Figure 11:
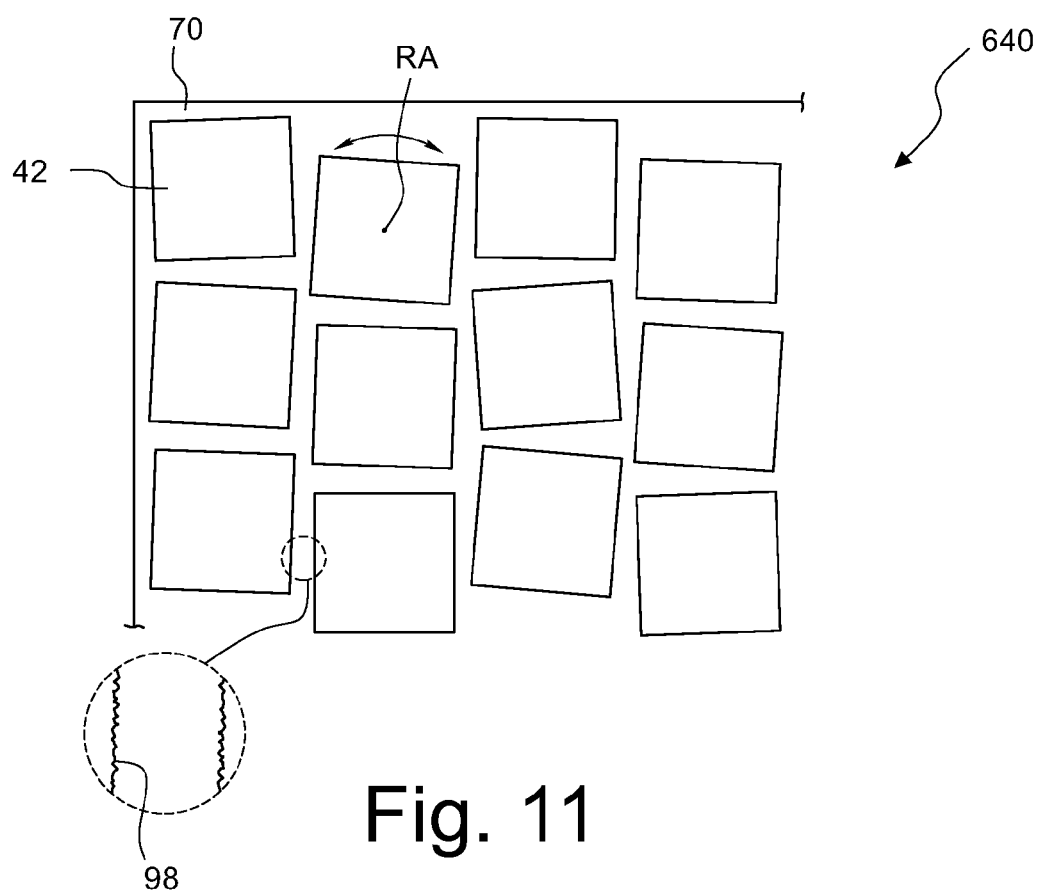
FIG. 11 is a top view on a mirror array according to a sixth embodiment comprising rotated mirrors.

FIG. 11 is a top view on a mirror array 640 according to a sixth embodiment. The configuration of the mirror array 640 is substantially identical to the configuration of the first embodiment shown in FIG. 5. Again, each micromirror 42 can be tilted by actuators 86, 88 (only shown in FIG. 5) that are supported by the modulator substrate 70 and are configured to tilt the micromirrors individually about two tilt axes. The micromirrors 42 have a circumferential shape this is obtained by rotating a basis shape (in this embodiment a square) around a rotational axis RA, which is at least substantially orthogonal to the tilt axes, by different angles. In this embodiment this rotational axis RA extends perpendicular to the plane of the drawing sheet.

It is to be noted that this does not imply that the micromirrors can be rotated around this axis RA during the operation of the light modulator. Such a rotational degree of freedom may be optionally provided, but is not mandatory. The term "rotation" here merely describes the structural arrangement of the mirror array 640 as being devised from a basis micromirror that is conceptionally rotated by different rotational angles. In the embodiment shown the rotational angles vary pseudo-randomly in a range between approximately 1° and 5°.

This pseudo-random arrangement reduces very effectively the regularity of the mirror array 640 and thus amount of diffraction induced stray light.

If the edges 98 of the micromirrors are irregularly frayed, as this is shown in the enlarged cutout in FIG. 11, this further helps to reduce the amount of diffraction induced stray light.

The invention claimed is:

1. A light modulator, comprising:
a substrate;
an array of mirrors comprising a first mirror and a second mirror, each mirror in the array of mirrors comprising a reflective surface with a shape; and
a plurality of actuators supported by the substrate,
wherein:
the plurality of actuators are configured to tilt the mirrors individually about two tilt axes;
for each mirror in the array of mirrors, the shape of the reflective surface is the same as the shape of the reflective surface of each of the other mirrors in the array of mirrors;
for each mirror in the array of mirrors, the shape of the reflective surface of the mirror has an orientation with respect to an axis which is substantially orthogonal to each of the two tilt axes; and the orientation of the shape of the reflective surface of the first mirror is different from the orientation of the shape of the reflective surface of the second mirror.

2. The light modulator of claim 1, wherein at least some edges of the reflective surfaces of the mirrors in the array of mirrors are irregularly shaped.

3. The light modulator of claim 1, wherein the orientations of the shapes of the reflective surfaces of the mirrors in the array of mirrors are pseudo-randomly distributed within a range of rotational angles.

4. The light modulator of claim 3, wherein at least some edges of the reflective surfaces of the mirrors in the array of mirrors are irregularly shaped.

5. The light modulator of claim 3, wherein the range is between 0.1° and 30°.

6. The light modulator of claim 5, wherein at least some edges of the reflective surfaces of the mirrors in the array of mirrors are irregularly shaped.

7. The light modulator of claim 3, wherein the range is between 1° and 5°.

8. The light modulator of claim 7, wherein at least some edges of the reflective surfaces of the mirrors in the array of mirrors are irregularly shaped.

9. The light modulator of claim 1, wherein the at least some of the mirrors in the array of mirrors are non-rotatable.

10. An illumination system, comprising
a light modulator according to claim 1,
wherein the illumination system is a microlithographic illumination system.

11. An apparatus, comprising:
an illumination system which comprises a light modulator according to claim 1, the illumination system being configured to illuminate an object in an object field; and
a projection objective configured to image at least a portion of the object into an image field,
wherein the apparatus is a microlithographic projection exposure apparatus.

12. A method of using a microlithographic projection exposure apparatus which comprises an illumination system and a projection objective, the method comprising:
using the illumination system to illuminate an object in an object field; and
using the projection objective to project at least a portion of the object into an image field,
wherein the illumination system comprises a light modulator according to claim 1.

13. A light modulator, comprising:
a substrate;
an array of mirrors comprising a first mirror and a second mirror, each mirror in the array of mirrors comprising a reflective surface having a shape; and
a plurality of actuators supported by the substrate,
wherein:
each mirror has at least two corresponding actuators configured to tilt the mirror individually about two tilt axes;
for each mirror in the array of mirrors, the shape of the reflective surface is the same as the shape of the reflective surface of each of the other mirrors in the array of mirrors;
for each mirror in the array of mirrors, the shape of the reflective surface of the mirror has an orientation with respect to an axis which is substantially orthogonal to each of the two tilt axes; and
the orientation of the shape of the reflective surface of the first mirror is different from the orientation of the shape of the reflective surface of the second mirror.

14. The light modulator of claim 13, wherein at least some edges of the reflective surfaces of the mirrors in the array of mirrors are irregularly shaped.

15. The light modulator of claim 14, wherein the orientations of the shapes of the reflective surfaces of the mirrors in the array of mirrors are pseudo-randomly distributed within a range of rotational angles.

16. The light modulator of claim 13, wherein the orientations of the shapes of the reflective surfaces of the mirrors in the array of mirrors are pseudo-randomly distributed within a range of rotational angles.

17. The light modulator of claim 13, wherein the at least some of the mirrors in the array of mirrors are non-rotatable.

18. An illumination system, comprising
a light modulator according to claim 13,
wherein the illumination system is a microlithographic illumination system.

19. An apparatus, comprising:
an illumination system which comprises a light modulator according to claim 13, the illumination system being configured to illuminate an object in an object field; and
a projection objective configured to image at least a portion of the object into an image field,
wherein the apparatus is a microlithographic projection exposure apparatus.

20. A method of using a microlithographic projection exposure apparatus which comprises an illumination system and a projection objective, the method comprising:
using the illumination system to illuminate an object in an object field; and
using the projection objective to project at least a portion of the object into an image field,
wherein the illumination system comprises a light modulator according to claim 13.

* * * * *